United States Patent
Ochi et al.

(10) Patent No.: US 10,249,477 B2
(45) Date of Patent: Apr. 2, 2019

(54) ION IMPLANTER AND ION IMPLANTATION METHOD

(71) Applicant: SUMITOMO HEAVY INDUSTRIES ION TECHNOLOGY CO., LTD., Tokyo (JP)

(72) Inventors: Syuta Ochi, Ehime (JP); Shiro Ninomiya, Ehime (JP); Yuuji Takahashi, Ehime (JP); Tadanobu Kagawa, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/937,346

(22) Filed: Mar. 27, 2018

(65) Prior Publication Data
US 2018/0286637 A1 Oct. 4, 2018

(30) Foreign Application Priority Data

Mar. 29, 2017 (JP) ................. 2017-064492

(51) Int. Cl.
*H01J 37/32* (2006.01)
*H01L 21/223* (2006.01)
*H01J 37/317* (2006.01)

(52) U.S. Cl.
CPC .... *H01J 37/32412* (2013.01); *H01J 37/3171* (2013.01); *H01J 37/3233* (2013.01); *H01J 37/32422* (2013.01); *H01L 21/2236* (2013.01)

(58) Field of Classification Search
CPC ............. H01J 37/32412; H01J 37/3171; H01J 37/32422
See application file for complete search history.

(56) References Cited

U.S. PATENT DOCUMENTS

| | | | | |
|---|---|---|---|---|
| 6,403,452 B1 * | 6/2002 | Murakoshi | ........ | H01L 21/26513 438/510 |
| 6,693,023 B2 * | 2/2004 | Murakoshi | ........ | H01L 21/26513 438/510 |
| 7,304,319 B2 | 12/2007 | Kawaguchi et al. | | |

(Continued)

FOREIGN PATENT DOCUMENTS

| | | | |
|---|---|---|---|
| JP | 2003-115276 A | 4/2003 |
| JP | 2006-156142 A | 6/2006 |
| JP | 4587766 B2 | 11/2010 |

*Primary Examiner* — Laura M Menz
(74) *Attorney, Agent, or Firm* — Michael Best & Friedrich LLP

(57) ABSTRACT

An ion implanter includes a plasma shower device configured to supply electrons to an ion beam with which a wafer is irradiated. The plasma shower device includes a plasma generating chamber provided with an extraction opening, a first electrode which is provided with an opening communicating with the extraction opening and to which a first voltage is applied with respect to an electric potential of the plasma generating chamber, a second electrode which is disposed at a position facing the first electrode such that the ion beam is interposed between the first and second electrodes and to which a second voltage is applied with respect to the electric potential of the plasma generating chamber, and a controller configured to independently control the first voltage and the second voltage to switch operation modes of the plasma shower device.

18 Claims, 6 Drawing Sheets

(56) References Cited

U.S. PATENT DOCUMENTS

| | | | | |
|---|---|---|---|---|
| 7,791,049 B2* | 9/2010 | Tsukihara | ............. | H01J 37/045 |
| | | | | 250/281 |
| 7,851,772 B2* | 12/2010 | Tsukihara | ............. | H01J 37/045 |
| | | | | 250/281 |
| 8,987,690 B2* | 3/2015 | Kabasawa | ........... | H01J 37/3007 |
| | | | | 250/492.21 |
| 9,466,467 B2* | 10/2016 | Kabasawa | ......... | H01J 37/32412 |
| 9,502,210 B2* | 11/2016 | Snao | .................... | H01J 37/244 |
| 2002/0130271 A1* | 9/2002 | Murakoshi | ........ | H01L 21/26513 |
| | | | | 250/424 |
| 2008/0251713 A1* | 10/2008 | Tsukihara | ............. | H01J 37/045 |
| | | | | 250/282 |
| 2008/0251737 A1* | 10/2008 | Tsukihara | ............. | H01J 37/045 |
| | | | | 250/492.21 |
| 2014/0150723 A1* | 6/2014 | Kabasawa | ......... | H01J 37/32412 |
| | | | | 118/723 R |
| 2014/0353517 A1* | 12/2014 | Kabasawa | ........... | H01J 37/3007 |
| | | | | 250/396 R |
| 2016/0042915 A1* | 2/2016 | Sano | .................... | H01J 37/244 |
| | | | | 250/492.3 |
| 2018/0286637 A1* | 10/2018 | Ochi | ................. | H01J 37/32412 |

* cited by examiner

ION IMPLANTER AND ION IMPLANTATION METHOD

RELATED APPLICATIONS

Priority is claimed to Japanese Patent Application No. 2017-064492, filed Mar. 29, 2017, the entire content of which is incorporated herein by reference.

BACKGROUND

Technical Field

Certain embodiment of the present invention relates to an ion implanter and an ion implantation method.

Description of Related Art

In a semiconductor manufacturing process, a process of implanting ions into a semiconductor wafer is normally performed in order to change conductivity of the semiconductor wafer, to change a crystal structure of the semiconductor wafer, or the like. In general, a device used in this process is referred to as an ion implanter and is configured to irradiate an ion beam toward a wafer in an implantation process chamber. A charge suppression device such as a plasma shower device is provided in the implantation process chamber in order to prevent a wafer surface from being charged by ion implantation. The plasma shower device supplies electrons to the wafer surface and thus, neutralizes an electric charge accumulated on the wafer surface.

SUMMARY

According to an embodiment of the present invention, there is provided an ion implanter, including: a plasma shower device configured to supply electrons to an ion beam with which a wafer is irradiated, in which the plasma shower device includes a plasma generating chamber provided with an extraction opening from which the electrons supplied to the ion beam are extracted, a first electrode which is provided with an opening communicating with the extraction opening and to which a first voltage is applied with respect to an electric potential of the plasma generating chamber, a second electrode which is disposed at a position facing the first electrode in a state where the ion beam is interposed between the first electrode and the second electrode and to which a second voltage is applied with respect to the electric potential of the plasma generating chamber, and a controller configured to independently control the first voltage and the second voltage to switch operation modes of the plasma shower device.

According to another embodiment of the present invention, there is provided an ion implantation method. This method uses an ion implanter including a plasma shower device configured to supply electrons to an ion beam with which a wafer is irradiated. The plasma shower device includes a plasma generating chamber provided with an extraction opening from which the electrons supplied to the ion beam are extracted, a first electrode which is provided with an opening communicating with the extraction opening and to which a first voltage is applied with respect to an electric potential of the plasma generating chamber, and a second electrode which is disposed at a position facing the first electrode in a state where the ion beam is interposed between the first electrode and the second electrode and to which a second voltage is applied with respect to the electric potential of the plasma generating chamber. In this method, the first voltage and the second voltage are independently controlled to switch operation modes of the plasma shower device according to a beam condition of the ion beam.

DETAILED DESCRIPTION

Figure 1:
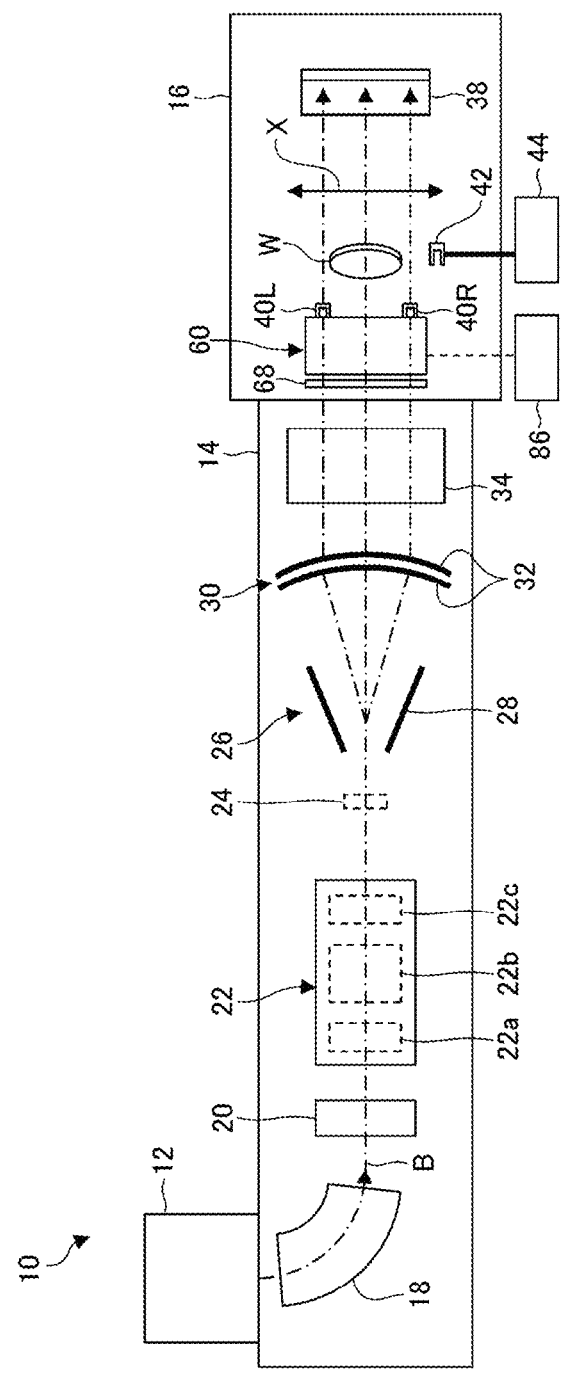
FIG. 1 is a top view showing a schematic configuration of an ion implanter according to an embodiment.

An electron supply amount required for a plasma shower device is changed according to a beam condition of an ion beam with which a wafer is irradiated. For example, if the beam is a high current beam of approximately 1 to 10 mA, more electron supply amount is required. Meanwhile, if the beam is a low/medium current beam of approximately 10 to 100 JA, the electron supply amount as much as that for the high current beam is not required. Accordingly, in general, in a high current implanter and a low/medium current implanter, plasma shower devices having different specifications are used, respectively. Meanwhile, in a case where one implanter is configured to be able to cover a range from a low/medium current region to a high current region, a plasma shower device capable of realizing an appropriate electron supply amount according to the beam condition is required.

It is desirable to provide a plasma shower device capable of dealing with a wide beam condition.

Aspects of the present invention include arbitrary combinations of the above-described elements and mutual substitutions of elements or expressions of the present invention among apparatuses, methods, systems, or the like.

According to the present invention, it is possible to a plasma shower device capable of dealing with a wide beam condition.

Hereinafter, an embodiment of the present invention will be described in detail with reference to the drawings. In descriptions of the drawings, the same reference numerals are assigned to the same elements, and redundant descriptions thereof are appropriately omitted. The below-described configurations are only examples and the scope of the present invention is not limited by the configurations.

Figure 2:
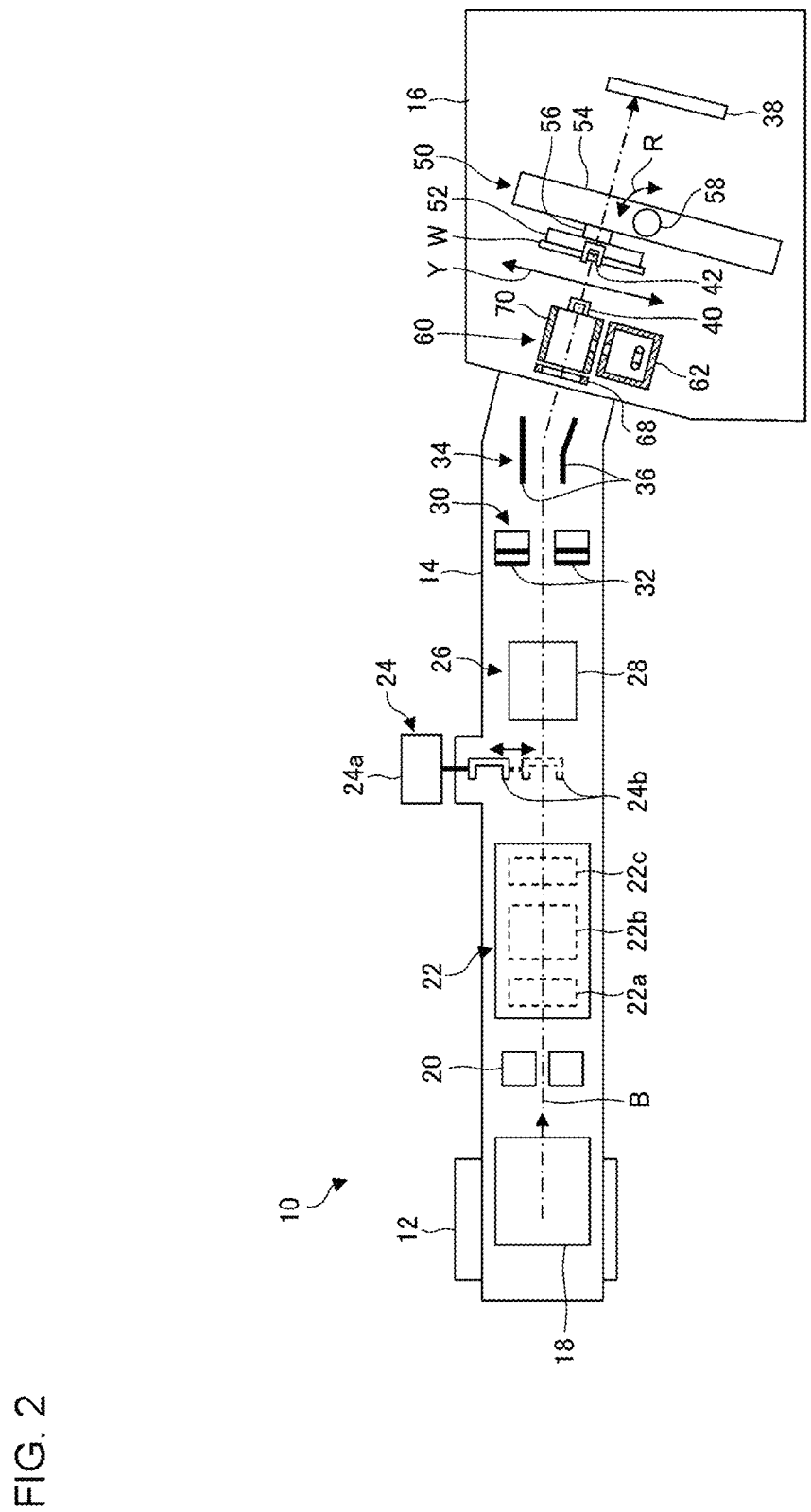
FIG. 2 is a side view showing the schematic configuration of the ion implanter of FIG. 1.

FIG. 1 is a top view schematically showing an ion implanter 10 according to an embodiment and FIG. 2 is a side view showing the schematic configuration of the ion implanter 10.

The ion implanter 10 is configured to implant ions into a surface of a workpiece W. For example, the workpiece W is a substrate or a semiconductor wafer. Hereinafter, for convenience of explanation, the workpiece W is referred to as a wafer W. However, this is not intended to limit an implantation target to a specific object.

The ion implanter 10 is configured to reciprocatingly perform scanning in one direction with a beam and reciprocatingly move the wafer W in a direction orthogonal to the one direction such that the entire wafer W is irradiated with an ion beam B. In the present specification, for convenience of explanation, a traveling direction of the ion beam B traveling along a designed beam trajectory is defined as a z direction and a plane perpendicular to the z direction is defined as an xy plane. In a case where the workpiece W is scanned with the ion beam B, a scanning direction is referred to as an x direction, and a direction orthogonal to the z direction and the x direction is referred to as a y direction. Accordingly, the reciprocating scanning of the beam is performed in the x direction and the reciprocating movement of the wafer W is performed in the y direction.

The ion implanter 10 includes an ion source 12, a beamline unit 14, and an implantation process chamber 16. The ion source 12 is configured to provide the ion beam B to the beamline unit 14. The beamline unit 14 is configured to transport ions from the ion source 12 to the implantation process chamber 16. The ion implanter 10 includes an evacuation system (not shown) for providing desired vacuum environments to the ion source 12, the beamline unit 14, and the implantation process chamber 16.

For example, the beamline unit 14 includes a mass analyzer 18, a variable aperture 20, a beam shaping unit 22, a first beam measurement instrument 24, a beam scanner 26, a parallelizing lens 30 or a beam parallelizing unit, and an angular energy filter (AEF) 34 in order from the upstream side. The upstream side of the beamline unit 14 indicates a side close to the ion source 12, and a downstream side thereof indicates a side close to the implantation process chamber 16 (or beam stopper 38).

The mass analyzer 18 is provided on the downstream side of the ion source 12 and is configured to select desired ion species from the ions extracted from the ion source 12 by mass analysis.

The variable aperture 20 is an aperture of which an opening width can be adjusted, and adjust a beam current of the ion beam B passing through the aperture by changing the opening width. For example, the variable aperture 20 may include aperture plates which are disposed in upper and lower positions in a state where a beam trajectory is interposed between the aperture plates and may adjust the beam current by changing a gap between the aperture plates.

The beam shaping unit 22 includes a focusing/defocusing lens such as a quadrupole focusing/defocusing unit (Q lens) and is configured to shape the ion beam B passing through the variable aperture 20 into a desired cross-sectional shape. The beam shaping unit 22 is an electric field type three-stage quadrupole lens (referred to as a triplet Q lens), and includes a first quadrupole lens 22a, a second quadrupole lens 22b, and a third quadrupole lens 22c in order from the upstream side. The beam shaping unit 22 can adjust convergence or divergence of the ion beam B incident into the wafer W independently in each of the x direction and the y direction using the three lens units 22a, 22b, and 22c. The beam shaping unit 22 may include a magnetic field type lens unit or may include a lens unit which shapes the beam using both an electric field and a magnetic field.

The first beam measurement instrument 24 is an injector flag Faraday cup which is disposed to be able to move into and out of the beam trajectory and measures a current of the ion beam. The first beam measurement instrument 24 is configured to be able to measure the beam current of the ion beam B which is shaped by the beam shaping unit 22. The first beam measurement instrument 24 includes a Faraday cup 24b which measures the beam current and a drive unit 24a which moves the Faraday cup 24b vertically. As shown by a dashed line in FIG. 2, in a case where the Faraday cup 24b is disposed on the beam trajectory, the ion beam B is blocked by the Faraday cup 24b. Meanwhile, as shown by a solid line in FIG. 2, in a case where the Faraday cup 24b is removed from the beam trajectory, the blocking of the ion beam B is released.

The beam scanner 26 is configured to supply the reciprocating scanning of the beam and is a deflector which performs scanning in the x direction with the shaped ion beam B. The beam scanner 26 includes a pair of scanning electrodes 28 which is provided to face each other in the x direction. The pair of scanning electrodes 28 is connected to a variable voltage power supply (not shown), which is periodically changes a voltage applied to the pair of scanning electrodes 28 to change an electric field generated between electrodes, and thus, the ion beam B is deflected in various angles. In this way, the scanning of the ion beam B is performed over a scanning range in the x direction. In FIG. 1, the scanning direction and the scanning range of the beam are exemplified by an arrow X, and a plurality of trajectories of the ion beam B in the scanning range are shown by chain lines.

The parallelizing lens 30 is configured to cause the traveling directions of the scanned ion beam B to be parallel with the designed beam trajectory, respectively. The parallelizing lens 30 includes a plurality of arc-shaped P lens electrodes 32 having a passing slit for the ion beam which is provided in the center portion of each P lens electrode 32. Each of the P lens electrodes 32 is connected to a high-pressure power supply (not shown) and applies an electric field generated by a voltage application to the ion beam B to parallelize the traveling direction of the ion beam B. The parallelizing lens 30 may be replaced by another beam parallelizing units, and the beam parallelizing unit may be configured of a magnet unit using a magnetic field. An AD (Acceleration/Deceleration) column (not shown) for accelerating or decelerating the ion beam B may be provided on the downstream side of the parallelizing lens 30.

The angular energy filter (AEF) 34 is configured to analyze an energy of the ion beam B, deflect ions having a desired energy downward, and lead the ions to the implantation process chamber 16. The angular energy filter 34 includes a pair of AEF electrodes 36 for deflecting by an electric field. The pair of AEF electrodes 36 is connected to the high-voltage power supply (not shown). In FIG. 2, by applying a positive voltage to the upper AEF electrode and a negative voltage to the lower AEF electrode, the ion beam B is deflected downward. The angular energy filter 34 may be configured of a magnet unit for deflecting by a magnetic field, or may be configured of a combination of the pair of AEF electrode for deflecting by the electric field and the magnet unit for deflecting by the magnetic field.

In this way, the beamline unit 14 supplies the ion beam B with which the wafer W is to be irradiated to the implantation process chamber 16.

As shown FIG. 2, a platen drive mechanism 50 holding one or a plurality of wafers W is included in the implantation process chamber 16. The platen drive mechanism 50 includes a wafer holding unit 52, a reciprocating motion mechanism 54, a twist angle adjustment mechanism 56, and a tilt angle adjustment mechanism 58. The wafer holding unit 52 includes an electrostatic chuck or the like for holding the wafer W. The reciprocating motion mechanism 54 reciprocates the wafer holding unit 52 in a reciprocating direction (y direction) orthogonal to the beam scanning direction (x direction), and thus, the wafer held by the wafer holding unit 52 is reciprocated in the y direction. In FIG. 2, the reciprocating motion of the wafer W is exemplified by an arrow Y.

The twist angle adjustment mechanism 56 is a mechanism which adjusts a rotation angle of the wafer W, and rotates the wafer W with a normal line of a wafer processed surface as a rotation axis so as to adjust a twist angle between an alignment mark provided on an outer peripheral portion of the wafer and a reference position. Here, the alignment mark of the wafer means a notch, an orientation flat or the like which is provided on the outer peripheral portion of the wafer, and is a mark which serves as a reference for an angular position in a crystal axis direction of the wafer or in a circumferential direction of the wafer. As shown in the drawings, the twist angle adjustment mechanism 56 is provided between the wafer holding unit 52 and the reciprocating motion mechanism 54 and is reciprocated together with the wafer holding unit 52.

The tilt angle adjustment mechanism 58 is a mechanism which adjusts an inclination of the wafer W and adjusts a tilt angle between the traveling direction of the ion beam B toward the wafer processed surface and the normal line of the wafer processed surface. In the present embodiment, among inclination angles of the wafer W, an angle having an axis in the x direction as a central axis of the rotation is adjusted as the tilt angle. The tilt angle adjustment mechanism 58 is provided between the reciprocating motion mechanism 54 and a side wall of the implantation process chamber 16 and is configured to rotate the entire platen drive mechanism 50 including the reciprocating motion mechanism 54 in an R direction so as to adjust the tilt angle of the wafer W.

The implantation process chamber 16 includes the beam stopper 38. In a case where the wafer W does not exist on the beam trajectory, the ion beam B is incident into the beam stopper 38. A second beam measurement instrument 44 for measuring a beam current or a beam current density distribution of the ion beam is provided in the implantation process chamber 16. The second beam measurement instrument 44 includes side cups 40R and 40L and a center cup 42.

The side cups 40R and 40L are disposed to be deviated in the x direction with respect to the wafer W and are disposed at positions at which the side cups 40R and 40L do not block the ion beam directed to the wafer during the ion implantation. The scanning of the ion beam B is performed beyond the range in which the wafer W is positioned, and thus, a portion of the scanning beam is incident into the side cups 40R and 40L during the ion implantation. Accordingly, the beam current is measured during the ion implantation. The measured values of the side cups 40R and 40L are sent to the second beam measurement instrument 44.

The center cup 42 measures the beam current or the beam current density distribution on the surface of the wafer W (wafer processed surface). The center cup 42 is movable, is retracted from a wafer position during the ion implantation, and is inserted into the wafer position when the wafer W is not positioned at an irradiation position. The center cup 42 measures the beam current while moving the x direction and measures the beam current density distribution in the beam scanning direction. The measured value of the center cup 42 is sent to the second beam measurement instrument 44. The center cup 42 may be formed in an array shape in which a plurality of Faraday cups are arranged in the x direction such that ion irradiation amounts at a plurality of positions in the beam scanning direction can be measured at the same time.

A plasma shower device 60 which supplies electrons to the ion beam B is provided in the implantation process chamber 16. The plasma shower device 60 includes a plasma generating chamber 62 and a shower tube 70. The plasma shower device 60 is configured to generate plasma in the plasma generating chamber 62, extract the electrons from the plasma, and supply the electrons into the shower tube 70 through which the ion beam B passes toward the wafer W.

Figure 3:
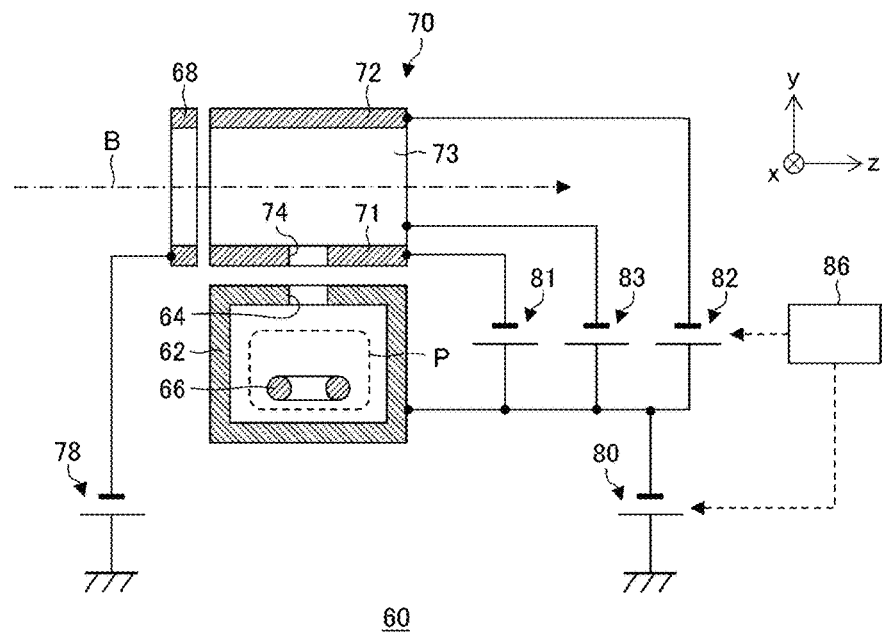
FIG. 3 is a sectional view showing a configuration of a plasma shower device according to the embodiment when viewed from an x direction.
Figure 4:
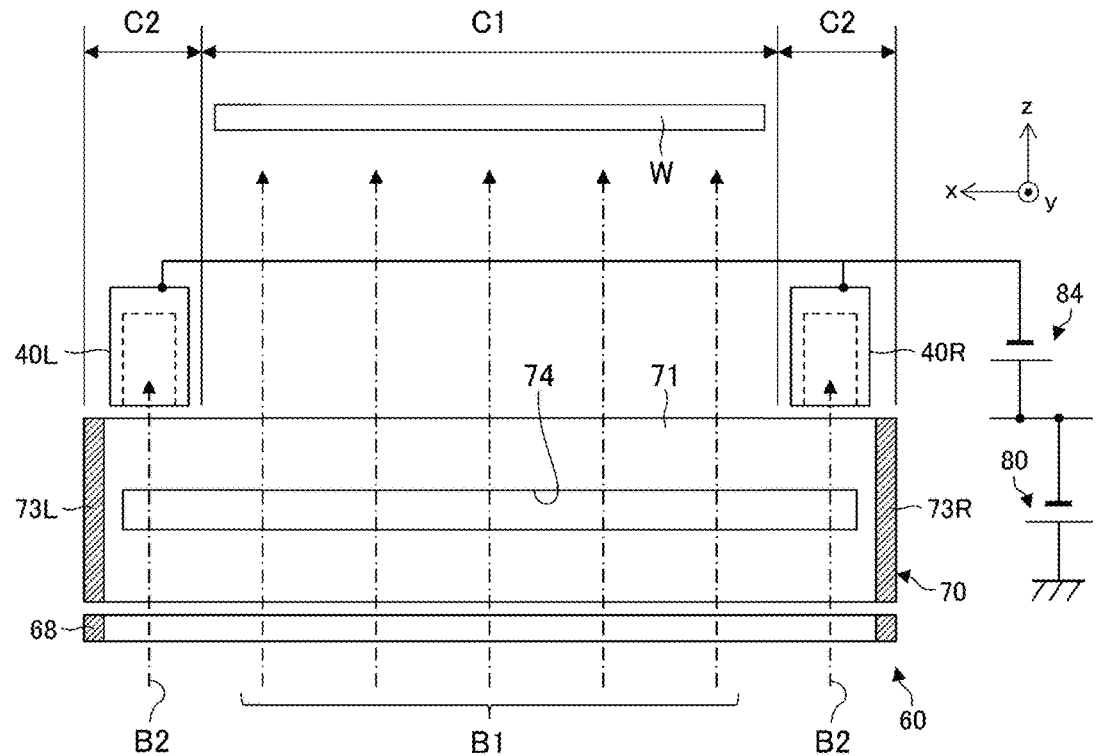
FIG. 4 is a sectional view showing the configuration the plasma shower device of FIG. 3 when viewed from a y direction.

FIGS. 3 and 4 are sectional views showing a configuration of the plasma shower device 60 according to an embodiment. FIG. 3 shows a cross section when viewed from the x direction and FIG. 4 shows a cross section when viewed from the y direction. The plasma shower device 60 includes the plasma generating chamber 62, a suppression electrode 68, the shower tube 70, a controller 86, and various power supplies.

The plasma generating chamber 62 has an approximately rectangular parallelepiped box shape and has an elongated shape in the scanning direction of the ion beam B (x direction). An antenna 66 to which a radio frequency (RF) voltage is applied is provided inside the plasma generating chamber 62. A source gas is introduced to the inside of the plasma generating chamber 62 and plasma P is generated by a radio frequency electric field caused by the antenna 66. A magnet unit (not shown) for generating a cusp magnetic field which confines the plasma P is provided in a wall of the plasma generating chamber 62. An extraction opening 64 is provided in the plasma generating chamber 62 and the electrons are extracted from the plasma P through the extraction opening 64.

The shower tube 70 is provided to be adjacent to the extraction opening 64 of the plasma generating chamber 62. The shower tube 70 has a rectangular tube shape and is disposed such that the ion beam B passes through the inside of the rectangular tube. The shower tube 70 includes a first electrode 71 which has an opening 74 communicating with the extraction opening 64, a second electrode 72 which faces the first electrode 71 in the y direction in a state where the ion beam B is interposed between the first electrode 71 and the second electrode 72, and third electrodes 73 (73L and 73R) which face each other in the x direction in a state where the ion beam B is interposed between the third electrodes 73. As shown in FIG. 4, the opening 74 provided in the first electrode 71 is formed to extend in the x direction over the scanning range of the ion beam B. The extraction opening 64 of the plasma generating chamber 62 is similar to the opening 74.

The suppression electrode 68 is provided on the upstream side of the shower tube 70. Similarly to the shower tube 70, the suppression electrode 68 has a rectangular tube shape and is disposed such that the ion beam B passes through the inside of the rectangular tube. The suppression electrode 68 is connected to a suppression power supply 78, and a negative voltage is applied to the suppression electrode 68 with respect to an electric potential of the plasma generating chamber 62. The suppression electrode 68 prevents the electrons extracted from the plasma generating chamber 62 from escaping to the upstream side from the plasma shower device 60.

The plasma generating chamber 62 is connected to an extraction power supply 80 and an extraction voltage is applied to the plasma generating chamber 62 by the extraction power supply 80. The first electrode 71 is connected to a first power supply 81 and a first voltage is applied to the first electrode 71 with respect to the electric potential of the plasma generating chamber 62. The second electrode 72 is connected to a second power supply 82 and a second voltage is applied to the second electrode 72 with respect to the electric potential of the plasma generating chamber 62. The third electrode 73 is connected to a third power supply 83 and a third voltage is applied to the third electrode 73 with respect to the electric potential of the plasma generating chamber 62.

FIG. 4 shows the scanning range of the ion beam B in the x direction. As shown in FIG. 4, an irradiation region C1 in which the wafer W is positioned and non-irradiation regions C2 outside the irradiation region C1 are scanned with the ion beam B. Beams B1 directed to the irradiation region C1 are implanted into the wafer W. Meanwhile, beams B2 directed to the non-irradiation regions C2 are incident into the side cups 40L and 40R on the downstream side of the shower tube 70.

The shower tube 70 is disposed to cover both of the irradiation region C1 and the non-irradiation regions C2, and is configured to be able to supply the electrons to both of the beams B1 toward the wafer W and the beams B2 toward the side cups 40L and 40R. Outer cases of the side cups 40L and 40R are connected to a fourth power supply 84 and a fourth voltage is applied to the outer cases with respect to the electric potential of the plasma generating chamber 62.

The controller 86 is configured to independently control the voltages of the various power supplies of the plasma shower device 60 so as to switch operation modes of the plasma shower device 60. The controller 86 switches the operation mode according to a beam condition such as a current value, an energy, and an ion species of the ion beam B with which the wafer W is irradiated.

Preferably, the amount of the electrons supplied from the plasma shower device 60 to the ion beam B is adjusted according to an amount of a positive electric charge on the wafer W accumulated by the irradiation of the ion beam B. For example, in a case where the current of the ion beam B is large, the amount of the positive electric charge accumulated on the wafer W increases, and thus, it is necessary to supply more electrons from the plasma shower device 60. Meanwhile, in a case where the current of the ion beam B is small, if a large amount of electrons is supplied from the plasma shower device 60, a negative electric charge is accumulated on the wafer W, and thus, it is preferable to decrease the electron supply amount.

For example, the ion implanter 10 according to the present embodiment is configured to be able to cover a range from a low current of approximately 10 μA to a high current of approximately 10 mA. Therefore, it is preferable that the electron supply amount generated by the plasma shower device 60 can be adjusted over a large range in accordance with a change in the beam current which extends over approximately three-digit range. For example, if the density of the plasma P generated in the plasma generating chamber 62 can be freely adjusted, the electron supply amount may be adjusted flexibly. However, in general, it is not easy to greatly change the density of the plasma P. This is because it is necessary to keep a certain degree of the density of the plasma P in order to stably generate the plasma P and it is difficult to stably supply electrons while extremely reducing the density of the plasma P.

The plasma shower device 60 supplies not only the electrons from the plasma P but also ions included in the plasma P. Some of the ions extracted from the plasma shower device 60 flow into the side cups 40L and 40R and affect measurement results. If the current of the ion beam B is large and the inflow of the ions due to the plasma shower device 60 is small enough to be negligible, there is no particular problem. However, in a case where the current of the ion beam B is low, the influx of ions extracted from the plasma shower device 60 affects the measurement results, and deteriorates measurement accuracy of the beam current.

Accordingly, in the present embodiment, the operation modes can be switched between a first mode in which the electron supply amount generated by the plasma shower device 60 increases and a second mode in which the ion flowing from the plasma shower device 60 into the side cups 40L and 40R decreases. Particularly, in the second mode for a low/medium e current, the electrons can be supplied while the ion supply from the plasma shower device 60 is minimized, and thus, it is possible to prevent the measurement accuracy from being deteriorated due to the ions from the plasma shower device 60 while suppressing charging of the wafer W.

Figure 5:
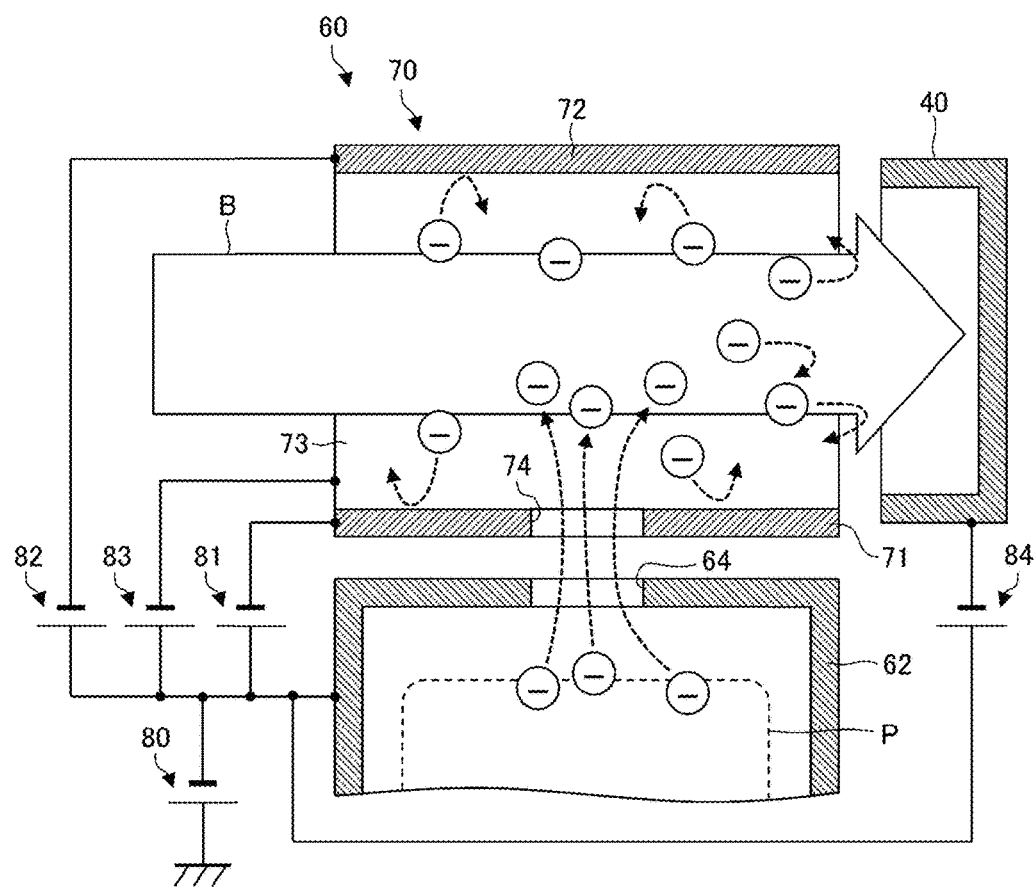
FIG. 5 is a view schematically showing the plasma shower device which is operated in a first mode.

FIG. 5 is a view schematically showing the plasma shower device 60 which is operated in the first mode. In the first mode, the first voltage, the second voltage, the third voltage and the fourth voltage are controlled to be negative. The magnitude (absolute value) of each of the first voltage, the second voltage, the third voltage, and the fourth voltage is 0.1 V to 50 V, and, for example, is 1 V to 20 V. In an example, the extraction voltage applied by the extraction power supply 80 is −5 V, and each of the first voltage, the second voltage, the third voltage, and the fourth voltage is −3 V. A suppression voltage applied by the suppression power supply 78 is approximately −40 V to −50 V, and for example, is −48 V. The voltages of the first voltage, the second voltage, the third voltage, and the fourth voltage need not be the same, and at least one voltage of them may be different from the other voltages.

The electrons supplied to the ion beam B are extracted from the plasma P in the plasma generating chamber 62 mainly by a beam potential of the ion beam B. Since the ion beam B consists of ions having a positive electric charge, the electrons are extracted from the plasma P by a positive space charge generated by the ion beam B. In the first mode, a negative voltage is applied to the shower tube 70 based on the electric potential of the plasma generating chamber 62, and thus, the electrons are repelled by an inner surface of the shower tube 70, and the extracted electrons are efficiently supplied to the ion beam B. A negative voltage is also applied to the outer cases of the side cups 40, and thus, the electrons can be prevented from flowing into the outer cases of the side cups 40, and the electrons can be efficiently supplied to the beams also at both ends of the beam scanning in the x direction.

Figure 6:
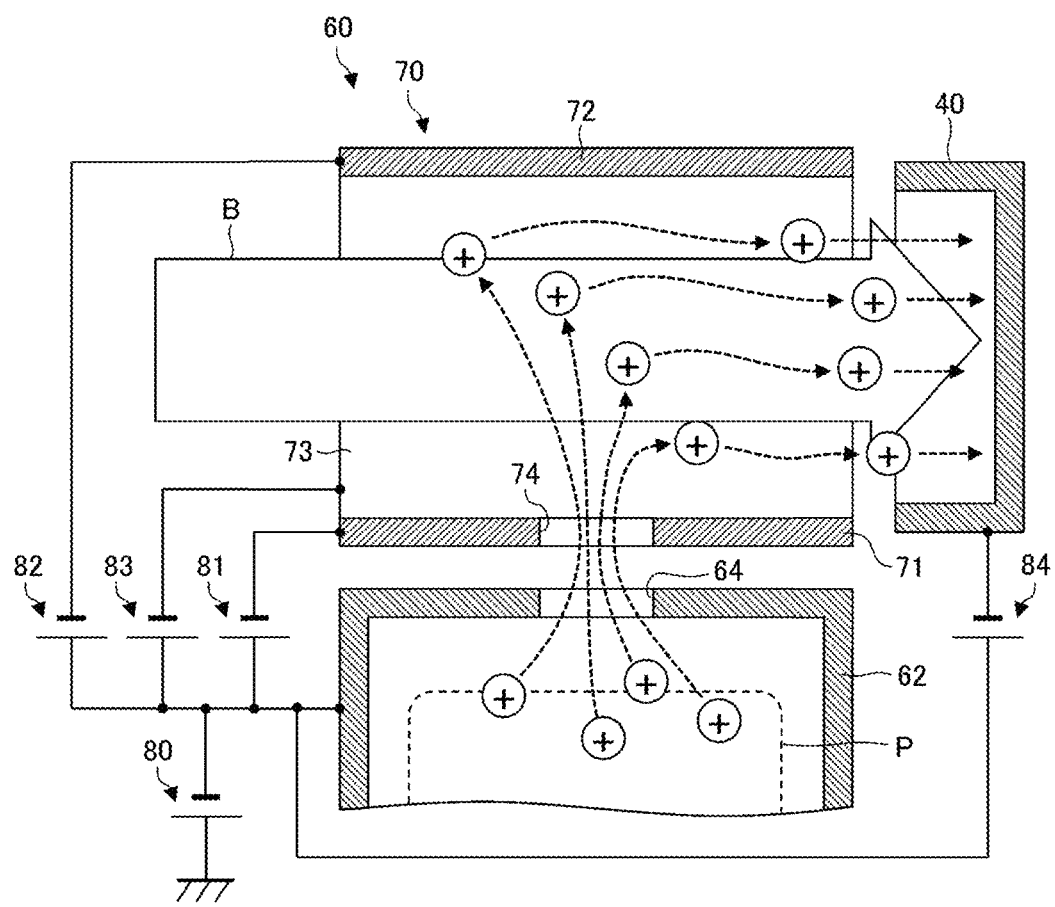
FIG. 6 is a view schematically showing a behavior of ions supplied from the plasma shower device in the first mode.

FIG. 6 is a view schematically showing a behavior of ions supplied from the plasma shower device 60 in the first mode. In the first mode, a negative voltage is applied to the shower tube 70, and thus, the first electrode 71 functions as an extraction electrode which extracts the ions from the plasma P in the plasma generating chamber 62. As a result, not only the electrons but also the ions are extracted from the plasma generating chamber 62. In a case where the ions are extracted together with the electrons from the plasma generating chamber 62, the space charge in the vicinity of the extraction opening 64 is neutralized by the ions, and thus, the electrons can be effectively extracted. In this way, in the first mode, the electron supply amount to the ion beam B can be maximized. Meanwhile, some of the extracted ions flow into the side cups 40, and thus, in a situation where the ion beam B detected by the side cups 40 is relatively small, they affects the measurement accuracy of the side cup 40, and the measurement accuracy of the side cup 40 deteriorates.

Figure 7:
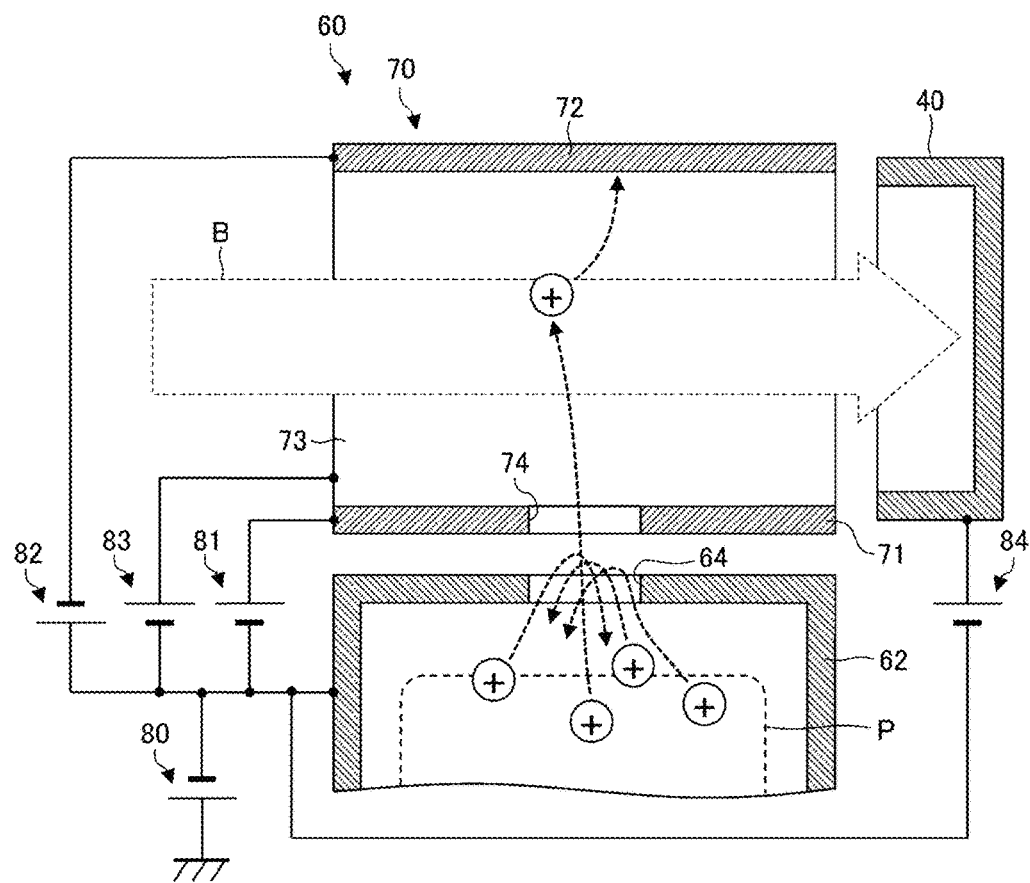
FIG. 7 is a view schematically showing the behavior of ions supplied from the plasma shower device which is operated in a second mode.

FIG. 7 is a view schematically showing the plasma shower device 60 which is operated in the second mode. In the second mode, while the first voltage of the first electrode 71, the third voltage of the third electrodes 73, and the fourth voltage of the outer cases of the side cups 40 are controlled to be positive, the second voltage of the second electrode 72 is controlled to be negative. In an example, the extraction voltage applied by the extraction power supply 80 is −7 V, and each of the first voltage, the third voltage, and the fourth voltage is +10 V, and the second voltage is −10 V. The suppression voltage applied by the suppression power supply 78 is approximately −40 V to −50V, and for example, is −48 V. The voltages of the first voltage, the third voltage, and the fourth voltage need not be the same, and at least one voltage of them may be different from the other voltages.

In the second mode, the first electrode 71 is positive with respect to the electric potential of the plasma generating chamber 62, and thus, the extraction of the ions from the plasma generating chamber 62 is suppressed. Even in a case where some ions are extracted through the extraction opening 64, the second electrode 72 has a negative voltage, and thus, the extracted ions mainly flow into the second electrode 72. The outer cases of the side cups 40 have a positive voltage, and thus, the extracted ions are not easily directed to the side cups 40. As a result, the amount of the ions directed from the plasma shower device 60 toward the side cups 40 decreases, and thus, it is possible to suppress the deterioration in the measurement accuracy of the ion beam B.

In the second mode, the current of the ion beam B is relatively small, and thus, the amount of the electrons extracted from the plasma P by the beam potential becomes small. The ions are not easily extracted from the plasma P, and thus, the electrons are easily accumulated in the vicinity of the extraction opening 64, and an extraction amount of the electrons decreases by the space charge effect. Accordingly, in the second mode, even in a state where the plasma P is stably generated, the electron supply amount can be much smaller than that in the first mode, and it is possible to supply the amount of the electrons matched to the low/medium current beam.

In the present embodiment, the first voltage to be applied to the first electrode 71 can be determined from the viewpoints of the ion supply from the plasma generating chamber 62, the electron supply from the plasma generating chamber 62, and the prevention of the inflow of the electrons into the shower tube 70. The ion supply amount and the electron inflow prevention effect tend to increase when the first electrode 71 is set to have a negative voltage and tend to decrease when the first electrode 71 is set to have a positive voltage. The electron supply amount tends to increase when the first electrode 71 is set to have a negative voltage having a small absolute value and tends to decrease when the first electrode 71 is set to have a negative voltage having a large absolute value or a positive voltage. It is preferable that the first voltage of the first electrode 71 is determined taking these factors into consideration.

The second voltage to be applied to the second electrode 72 can be determined from the viewpoints of the prevention of the inflow of the electrons into the shower tube 70 and ion absorption into the shower tube 70. The electron inflow prevention effect and the ion absorption capability increases when the second electrode 72 is set to have a negative voltage and decreases when the second electrode 72 is set to have a positive voltage. Accordingly, it is preferable that a negative voltage is applied to the second electrode 72 and that the magnitude of the negative voltage is determined according to required levels of electron inflow prevention effect and the ion absorption capacity.

Third voltage to be applied to the third electrodes 73 can be determined from the viewpoints from the ion supply from the plasma generating chamber 62, the electron supply from the plasma generating chamber 62, the prevention of the inflow of the electrons into the shower tube 70, and the ion absorption into the shower tube 70. The relationship between the third voltage and these effects is similar in the cases of the first electrode and second electrode described above. It is preferable that the third voltage of the third electrodes 73 is determined taking the factors described above into consideration.

The fourth voltage to be applied to the outer cases of the side cups 40 can be determined from the viewpoints of the prevention of the inflow of the electrons into the outer cases of the side cups 40 and the prevention of the inflow of the ions into the side cups 40. The electron inflow prevention effect increases when the fourth voltage is set to have a negative voltage and decreases when the fourth voltage is set to have a positive voltage. Meanwhile, the ion inflow prevention effect increases when the fourth voltage is set to have a positive voltage and decreases when the fourth voltage is set to have a negative voltage. Accordingly, it is preferable that the fourth voltage to be applied to the outer cases of the side cups 40 is determined taking these factors into consideration.

It should be understood that the invention is not limited to the above-described embodiment, but may be modified into various forms on the basis of the spirit of the invention. Additionally, the modifications are included in the scope of the invention.

In the above-described embodiment, the case is described, in which separate power supplies are respectively connected to the first electrode 71, the second electrode 72, the third electrodes 73, and the outer cases of the side cups 40. In a modification example, the same power supply may be used for electrodes with common applied voltages. For example, the first power supply 81 may be connected to the first electrode 71, the third electrodes 73, and the outer cases of the side cups 40, and the second power supply 82 may be connected to the second electrode 72.

In the above-described embodiment, the case is described, in which some power supplies are connected between the plasma generating chamber 62 and the shower tube 70 and the other power supply is connected between the plasma generating chamber 62 and the outer cases of the side cups 40 with respect to the electric potential of the plasma generating chamber 62 to which the extraction power supply 80 is connected. In a modification example, one end of each of the first power supply 81, the second power supply 82, and the third power supply 83 connected to the shower tube 70 and one end of the fourth power supply 84 connected to the outer cases of the side cups 40 may be connected to the ground, and the voltage of each electrode of the shower tube 70 and the voltage of the outer cases of the side cups 40 may be controlled with respect to the ground electric potential. Also in this case, it is preferable that a positive or a negative voltage is controlled to be applied to each electrode of the shower tube 70 and the outer cases of the side cups 40 with respect to the electric potential of the plasma generating chamber 62.

In the above-described embodiment, the case is described, in which a negative voltage is applied to the third electrode 73 in the first mode and a positive voltage is applied to the third electrode 73 in the second mode such that polarities of the voltages of the first electrode 71 and the third electrodes 73 are the same as each other. In a modification example, polarities of the voltages of the second electrode 72 and the third electrodes 73 may be the same as each other, a negative voltage may be applied to the third electrodes 73 also in the first mode, and a negative voltage may be applied to the third electrode 73 in the second mode.

In the above-described embodiment, the first electrode 71 and the third electrode 73 may be configured to be electrically connected to each other, and for example, the first electrode 71 and the third electrode 73 may be integrally configured. Meanwhile, the second electrode 72 and the third electrodes 73 are electrically insulated, and insulating members are provided between the second electrode 72 and the third electrodes 73. In a modification example, the second electrode 72 and the third electrodes 73 may be configured to be electrically connected to each other, and insulating members may be provided between the first electrode 71 and the third electrodes 73. Insulating members may be provided between the first electrode 71 and the third electrodes 73 and between the second electrode 72 and the third electrodes 73.

The shower tube 70 may not have the third electrodes 73 while having the first electrode 71 and the second electrode 72.

The side cups 40 may be provided to be separated away from the shower tube 70. Different voltages according to the operation modes may not be applied to the outer cases of the side cups 40, and the voltage may be fixed to be a ground electric potential, for example.

In the above-described embodiment, the case is described, in which the voltage of each electrode of the shower tube 70 is set to have a positive voltage or a negative voltage with respect to the plasma generating chamber 62. In a modification example, the voltage of at least one of electrodes may be the same as that of the plasma generating chamber 62 in an operation mode.

The controller 86 may control a voltage of another structure disposed in the vicinity of the shower tube 70. For example, the another structure disposed in the vicinity of the shower tube 70 may be set to have a negative voltage in the first mode and may be set to have a positive voltage in the second mode, with respect to the electric potential of the plasma generating chamber 62 is.

What is claimed is:
1. An ion implanter, comprising:
a plasma shower device configured to supply electrons to an ion beam with which a wafer is irradiated,
wherein the plasma shower device includes
a plasma generating chamber provided with an extraction opening from which the electrons supplied to the ion beam are extracted,
a first electrode which is provided with an opening communicating with the extraction opening and to which a first voltage is applied with respect to an electric potential of the plasma generating chamber,
a second electrode which is disposed at a position facing the first electrode in a state where the ion beam is interposed between the first electrode and the second electrode and to which a second voltage is applied with respect to the electric potential of the plasma generating chamber, and
a controller configured to independently control the first voltage and the second voltage to switch operation modes of the plasma shower device.
2. The ion implanter according to claim 1,
wherein the controller changes at least one of the first voltage and the second voltage according to a beam condition of the ion beam to switch the operation mode.
3. The ion implanter according to claim 1,
wherein the controller switches the operation mode according to a beam current value of the ion beam.
4. The ion implanter according to claim 1,
wherein the controller switches the operation mode according to beam energy of the ion beam.
5. The ion implanter according to claim 1,
wherein the controller switches the operation mode according to an ion species of the ion beam.
6. The ion implanter according to claim 1,
wherein the operation mode includes a first mode in which at least one of the first voltage and the second voltage is negative and a second mode in which at least one of the first voltage and the second voltage is positive.
7. The ion implanter according to claim 6,
wherein in the first mode, the first voltage is negative, and
wherein in the second mode, the first voltage is positive.
8. The ion implanter according to claim 6,
wherein in the first mode, the second voltage is negative.
9. The ion implanter according to claim 6,
wherein in the second mode, the second voltage is negative.
10. The ion implanter according to claim 6,
wherein the first mode is a high current mode selected in a case where a beam current value of the ion beam is a predetermined value or more, and
wherein the second mode is a low current mode selected in a case where the beam current value of the ion beam is less than the predetermined value.
11. The ion implanter according to claim 1,
wherein the controller independently controls the first voltage and the second voltage such that each of absolute values of the first voltage and the second voltage is 0.1 V to 50 V.
12. The ion implanter according to claim 1, further comprising:
a beam scanner provided on an upstream side of the plasma shower device,
wherein the beam scanner is configured to reciprocatingly scan the ion beam in a predetermined beam scan direction orthogonal to a beam traveling direction, and
wherein the first electrode and the second electrode are disposed to face each other in a direction orthogonal to both the beam traveling direction and the beam scan direction.
13. The ion implanter according to claim 12,
wherein the plasma shower device further includes a pair of third electrodes which is disposed to face each other in the beam scan direction in a state where the ion beam is interposed between the pair of third electrodes and to which a third voltage is applied with respect to the electric potential of the plasma generating chamber, and
wherein the controller further controls the third voltage to switch the operation mode.
14. The ion implanter according to claim 13,
wherein the controller controls the third voltage such that a polarity of the third voltage is the same as that of the first voltage.
15. The ion implanter according to claim 13,
wherein the controller controls the third voltage such that the third voltage is same as the first voltage.

16. The ion implanter according to claim 12,
wherein the beam scanner is configured to reciprocatingly scan the ion beam over a range including an implantation region in which the wafer is positioned and a non-implantation region except for the implantation region,
wherein the ion implanter further comprises a side cup which is disposed on a downstream side of the plasma shower device and is configured to monitor a beam current value of the ion beam in the non-implantation region during implantation to the wafer, and
wherein the controller further controls a fourth voltage applied to a housing of the side cup with respect to the electric potential of the plasma generating chamber to switch the operation mode.

17. The ion implanter according to claim 16,
wherein the controller controls the fourth voltage such that a polarity of the fourth voltage is the same as that of the first voltage.

18. An ion implantation method using an ion implanter including a plasma shower device configured to supply electrons to an ion beam with which a wafer is irradiated, the plasma shower device including a plasma generating chamber provided with an extraction opening from which the electrons supplied to the ion beam are extracted, a first electrode which is provided with an opening communicating with the extraction opening and to which a first voltage is applied with respect to an electric potential of the plasma generating chamber, and a second electrode which is disposed at a position facing the first electrode in a state where the ion beam is interposed between the first electrode and the second electrode and to which a second voltage is applied with respect to the electric potential of the plasma generating chamber, the ion implantation method comprising:

independently controlling the first voltage and the second voltage according to a beam condition of the ion beam to switch an operation mode of the plasma shower device.

* * * * *